US006462987B2

(12) United States Patent
Geraci et al.

(10) Patent No.: US 6,462,987 B2
(45) Date of Patent: Oct. 8, 2002

(54) DIRECT-COMPARISON READING CIRCUIT FOR A NONVOLATILE MEMORY ARRAY

(75) Inventors: Antonino Geraci, Monza; Carlo Lisi, Milan; Lorenzo Bedarida, Vimercate; Marco Sforzin, Novedrate, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/930,875

(22) Filed: Aug. 15, 2001

(65) Prior Publication Data

US 2002/0031011 A1 Mar. 14, 2002

(30) Foreign Application Priority Data

Aug. 16, 2000 (EP) .............................................. 00830582

(51) Int. Cl.[7] .............................................. G11C 16/06
(52) U.S. Cl. .............................. 365/185.2; 365/185.21; 365/185.25
(58) Field of Search ...................... 365/185.2, 185.21, 365/185.25

(56) References Cited

U.S. PATENT DOCUMENTS

| 5,396,467 A | | 3/1995 | Liu et al. ...................... 365/210 |
| 5,559,737 A | | 9/1996 | Tanaka et al. ............... 365/185.25 |
| 5,627,790 A | * | 5/1997 | Golla et al. .................. 365/185.21 |
| 6,333,885 B1 | * | 12/2001 | Bedarida et al. ............. 365/185.21 |
| 6,363,015 B1 | * | 3/2002 | Barcella et al. .............. 365/185.2 |

FOREIGN PATENT DOCUMENTS

JP 4-28096 1/1992

OTHER PUBLICATIONS

Amin, A.M., "Design and Analysis of a High–Speed Sense Amplifier for Single–Transistor Nonvolatile Memory Cells," *IEEE Proceedings–G*, 140(2):117–122, Apr. 1993.

* cited by examiner

*Primary Examiner*—Trong Phan
(74) *Attorney, Agent, or Firm*—Lisa K. Jorgenson; Robert Iannucci; Seed IP Law Group PLLC

(57) ABSTRACT

A direct-comparison reading circuit for a nonvolatile memory array having a plurality of memory cells arranged in rows and columns, and at least one bit line, includes at least one array line, selectively connectable to the bit line, and a reference line; a precharging circuit for precharging the array line and reference line at a preset precharging potential; at least one comparator having a first terminal connected to the array line, and a second terminal connected to the reference line; and an equalization circuit for equalizing the potentials of the array line and reference line in the precharging step. In addition, the reading circuit includes an equalization line distinct from the reference line; and controlled switches for connecting, in the precharging step, the equalization line to the array line and to the reference line, and for disconnecting the equalization line from the array line and from the reference line at the end of the precharging step.

16 Claims, 2 Drawing Sheets

US 6,462,987 B2

DIRECT-COMPARISON READING CIRCUIT FOR A NONVOLATILE MEMORY ARRAY

BACKGROUND OF THE INVENTION

1. Field of the Invention

The present invention refers to a direct-comparison reading circuit for a nonvolatile memory array.

2. Description of the Related Art

It is known that the circuits traditionally used for reading nonvolatile memory cells, wherein the current flowing in selected memory cells and the current flowing in a reference cell are compared by current-mirror architectures, present considerable limits of use in presence of low supply voltages or whenever a particularly high reading speed is required.

To overcome the above limits, it has recently been proposed to use direct-comparison reading circuits (the so-called dynamic sense circuits) which enable lower access times to be achieved and, moreover, low supply voltages to be used. In this type of reading circuits, array bit lines, connected to respective selected array memory cells to be read, and a reference bit line connected to a reference cell, are initially brought to a preset precharge voltage through a precharge circuit. The array capacitance and the reference capacitance, respectively associated to each of the array bit lines and to the reference bit line, are thus charged at the same precharge voltage. In addition, a read voltage is supplied to the gate terminals of the array cells and of the reference cell.

Subsequently, the precharge circuit is disconnected, and the array and reference capacitances are discharged via the array cells and the reference cell to which they are respectively connected. In this phase, programmed array cells (ie., ones having a high threshold voltage) conduct a practically zero current, and consequently discharging of the associated capacitances takes place very slowly. Erased array cells (which have a low threshold voltage) are instead on and enable fast discharge of the capacitances connected thereto. The discharge speed of the reference capacitance is intermediate with respect to the above two cases, since the reference bit line is designed to conduct a current equal to approximately one half of the cell current.

Consequently, the voltage on the reference bit line is always higher than the voltages on the array bit lines connected to erased array cells, and always lower than the voltages on the array bit lines connected to programmed array cells.

The voltages on the array bit lines are then compared with the voltage on the reference bit line using respective comparators. In this way, the logic values at the outputs of the comparators are correlated to the logic values stored in the cells associated to the comparators.

Since no current mirrors are used to compare the currents flowing in the array cells and in the reference cells, direct-comparison reading circuits can operate with lower supply voltages than in traditional reading circuits and, moreover, have shorter access times and lower consumption.

However, known direct-comparison reading circuits have certain drawbacks, mainly on account of the capacitive mismatching between the array bit lines and the reference bit line. In fact, since a same voltage should be present on all the array bit lines and on the reference bit line at the start of the discharge phase (reading), it is necessary to carry out an equalization. Equalization is normally obtained by connecting each array bit line to the reference bit line through a respective equalization switch. Therefore, the reference bit line is associated not only to the capacitance of a single array bit line, but also the capacitances connected to all the equalization switches, even if the latter are open. In addition, the reference bit line is connected to all the comparators, which affect the operation due to their respective input capacitances. Consequently, discharge of the reference bit line takes place more slowly than expected, and errors may occur when reading erased cells (also these discharge slowly).

In addition, also regulation of the precharge voltage is problematic. Normally, in fact, a regulating circuit is used which is connected to all the array bit lines and to the reference bit line. In this case, oscillations of the precharge voltage may be set up, due to the various lines reaching the precharge voltage according to different transients. Alternatively, precharging is performed for a preset time interval, without feedback control. In this case, an imprecision in the precharge time may lead to a non-optimal precharge voltage.

SUMMARY OF THE INVENTION

An embodiment of the present invention provides a reading circuit free from the above described drawbacks.

An embodiment of the invention provides a direct-comparison reading circuit for a nonvolatile memory array having a plurality of memory cells arranged in rows and columns, and a bit line. The reading circuit includes: an array line, selectively connectable to the bit line; a reference line; a precharging circuit for precharging the array line and the reference line at a preset precharging potential; a comparator having a first terminal connected to the array line and a second terminal connected to the reference line; and equalization means for equalizing potentials of the array line and reference line in a precharging step. The equalization means include an equalization line distinct from the reference line and controlled connection means for connecting, in the precharging step, the equalization line to the array line and to the reference line, and for disconnecting the equalization line (from the array line and from the reference line, at the end of the precharging step.

BRIEF DESCRIPTION OF THE DRAWINGS

For a better understanding of the present invention, there is now described a preferred embodiment thereof, purely to furnish a non-limiting example, with reference to the attached drawings, in which.

DETAILED DESCRIPTION OF THE INVENTION

Figure 1:
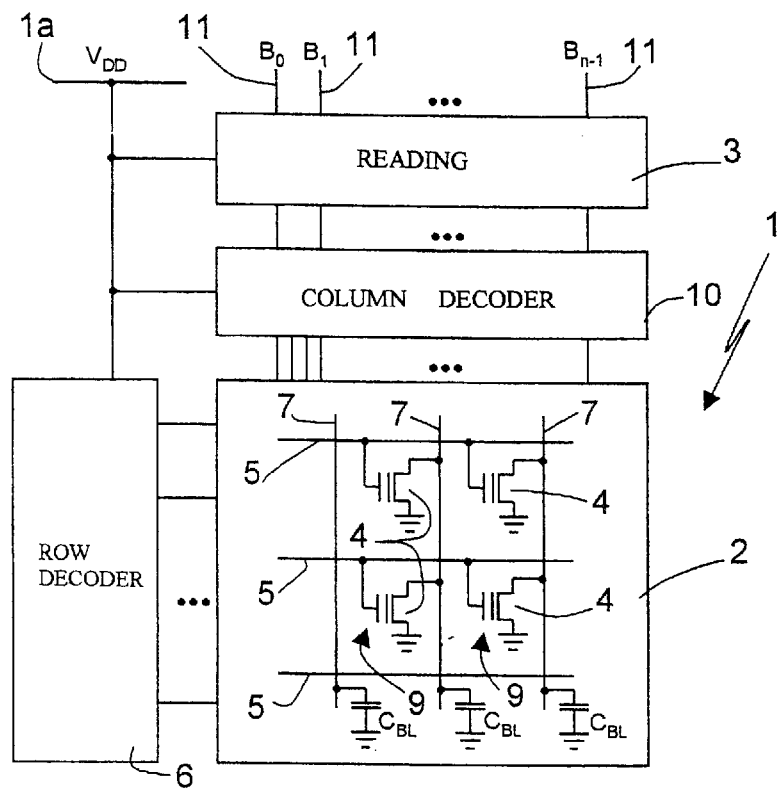
FIG. 1 is a simplified block diagram of a nonvolatile memory.

As shown in FIG. 1, a nonvolatile memory 1, for example a flash memory supplied with a supply voltage lower than 1.8 V, comprises a memory array 2 and a reading circuit 3.

The memory array 2 comprises a plurality of array cells 4 arranged in rows and columns. In particular, the array cells 4 belonging to a same row have gate terminals connected to a respective word line 5, connected to a row decoder circuit 6 of known type; and the array cells 4 belonging to a same column 9 have drain terminals connected to a respective bit line 7. Bit line capacitances $C_{BL}$ are associated with the respective bit lines 7, are roughly equal to each other and are schematically represented by capacitors connected between the bit lines 7 and ground.

A column decoder 10, also of known type, selectively connects a preset number N of bit lines 7 (for example 64) to the reading circuit 3, which has an equal number N of output terminals 11 supplying respective logic signals $B_0$, $B_1, \ldots, B_{N-1}$ correlated to the logic values stored in array cells 4 that are selected to be read.

The reading circuit 3, row decoders 6 and column decoders 10 are moreover connected to a supply line 1a supplying a supply voltage $V_{DD}$.

Figure 2:
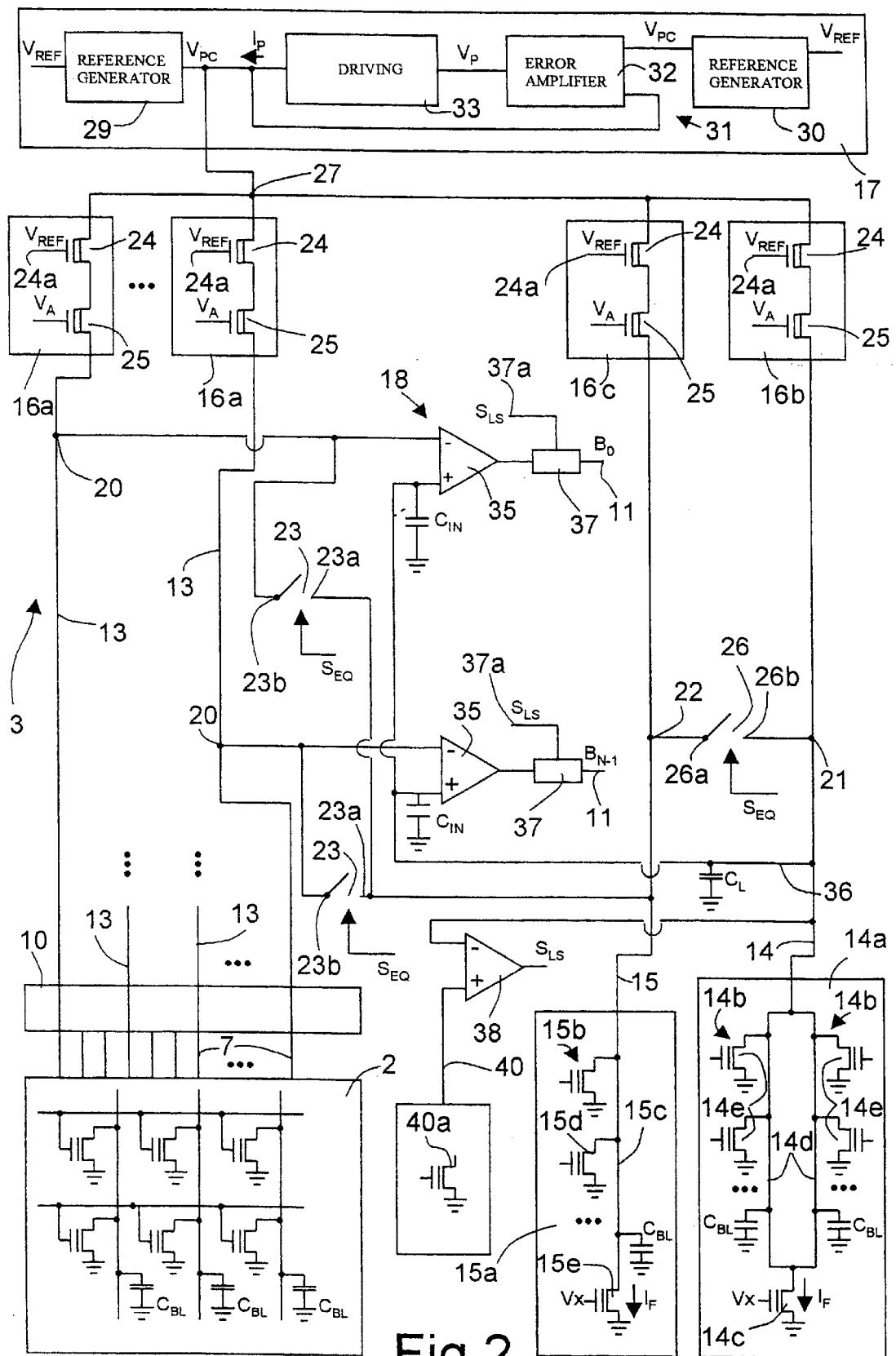
FIG. 2 illustrates a simplified circuit diagram of a reading circuit according to the present invention, forming part of the memory of FIG. 1.

With reference to FIG. 2, the reading circuit 3 comprises a plurality of array lines 13, a reference line 14 connected to a reference branch 14a, an equalization line 15 connected to an equalization branch 15a, a plurality of control circuits 16a–16c, a precharge circuit 17, and a comparison stage 18.

The bit lines 7 that are selected to be read (schematically represented by solid lines through the column decoder 10) are connected, via respective array lines 13, to respective array nodes 20 which can be selectively connected to a common precharge node 27 via respective array control circuits 16a.

The reference branch 14a preferably comprises a pair of reference columns 14b, equal to the columns 9 of the memory array 2 and connected in parallel between a reference node 21 and the drain terminal of a reference cell 14c. The reference cell 14c has its source terminal connected to ground and receives on its gate terminal a read voltage $V_x$, so as to conduct a current $I_F$ equal to the current flowing in the erased array cells 4. Each of the reference columns 14b comprises a connection line 14d connected between the reference node 21 and the drain terminal of the reference cell 14c, and a plurality of memory cells 14e having respective drain terminals connected to the connection line 14d and respective source terminals connected to ground. The memory cells 14e are always off and do not conduct current. The connection lines 14d are associated to respective capacitances equal to the bit line capacitance $C_{BL}$, and, consequently, the overall capacitance associated to the reference line 14 is $2C_{BL}$. In addition, the reference node 21 can be selectively connected to the precharge circuit 17 via a reference control circuit 16b.

The equalization branch 15a preferably comprises an equalization column 15b, equal to the columns 9 of the memory array 2. The equalization column 15b comprises a connection line 15c and a plurality of memory cells 15d having respective drain terminals connected to the connection line 15c and respective source terminals connected to ground. The memory cells 15d are always off and do not conduct current. In addition, the connection line 15c is connected between an equalization node 22 and the drain terminal of an equalization cell 15e. The equalization cell 15e has its source terminal connected to ground and receives on its gate terminal the read voltage $V_x$, in order to conduct a current $I_F$ equal to the current flowing in the erased array cells 4. In addition, the connection line 15c is associated to a capacitance equal to the bit line capacitance $C_{BL}$. Furthermore, the equalization node 22 is selectively connectable to the precharging circuit 17 via an equalization control circuit 16c.

The equalization node 22 is connected to all the array nodes 20 via respective first equalization switches 23, and to the reference node 21 via a second equalization switch 26. In detail, each first equalization switch 23 has a first terminal 23a connected to the equalization node 22 and a second terminal 23b connected to a respective array node 20; and the second equalization switch 26 has a first terminal 26a connected to the equalization node 15 and a second terminal 26b connected to the reference node 21. Furthermore, a single equalization signal $S_{EQ}$ controls opening and closing of the equalization switches 23, 26.

Figure 3:
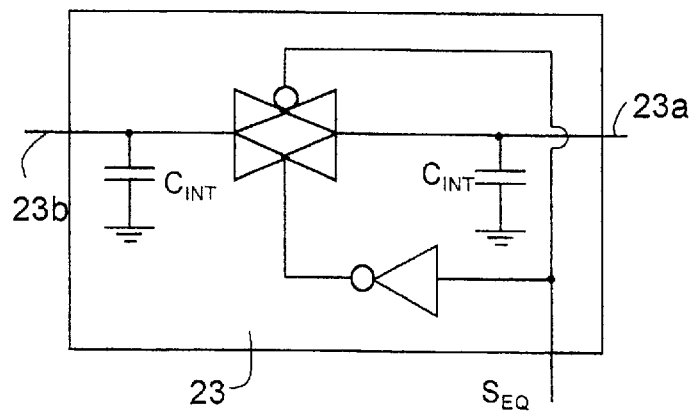
FIG. 3 is a more detailed circuit diagram of one part of the reading circuit of FIG. 2.

Preferably, the equalization switches 23, 26 are formed by respective CMOS transfer-gate switches receiving the equalization signal $S_{EQ}$ in direct form and in negated form, as illustrated in FIG. 3. Since two switch capacitances $C_{INT}$ are associated to each equalization switch 23, 26, one for each terminal 23a, 23b, 26a, 26b, an equalization capacitance $C_{EQ}$ is associated to the equalization node 22 and is equal to the sum of the line capacitance $C_{BL}$ and the switch capacitances $C_{INT}$ of the N+1 equalization switches 23, 26 connected to the equalization node 22, of which N are used for the array node 20, and one for the reference node 21.

Each of the control circuits 16a, 16b, 16c comprises a respective control transistor 24 and a respective enabling transistor 25, both of natural NMOS type and having a same threshold voltage $V_T$, of, for example, 0.25 V.

In detail, the control transistor 24 has its drain terminal connected to the precharge node 27 and its source terminal connected to the drain terminal of the enabling transistor 25; in addition, the control transistor 24 receives on its gate terminal 24a a reference voltage $V_{REF}$, generated by a biasing circuit of a band-gap type (known, and for convenience not shown) and independent both of the supply voltage of the memory 1 and of the temperature. In each array control circuit 16a, the enabling transistor 25 has a drain terminal connected to a respective array node 20; the enabling transistors 25 of the reference control circuit 16b and equalization circuit 16c are connected to the reference node 21 and, respectively, to the equalization node 22. In addition, all the enabling transistors 25 receive on their gate terminals an enabling voltage $V_A$, supplied by a voltage boosting circuit of known type and not shown.

The precharge circuit 17 comprises a first and a second reference generators 29, 30, and a regulator 31, the latter being arranged between the reference generators 29, 30 and including an error amplifier 32 and a driving stage 33.

The reference generators 29, 30 are of a low-consumption type so that they can be kept active also in standby, and receive the reference voltage $V_{REF}$ and supply, on respective output terminals, a same precharge voltage $V_{PC}$ equal to $V_{REF}-V_T$, where $V_T$ is the threshold voltage of a natural NMOS transistor. In particular, the output terminal of the first reference generator 29 is connected to the precharge node 27, and the output terminal of the second reference generator 30 is connected to a first input terminal of the error amplifier 32.

The error amplifier 32 has a second input terminal, connected to the precharge node 27, and an output terminal, connected to an input of the driving circuit 33 and supplying a driving voltage $V_P$. The driving voltage is correlated to the difference between the voltages at the inputs of the error amplifier 32, i.e., between the voltage at the precharge node 27 and the precharge voltage $V_{PC}$.

The driving circuit 33 has an output terminal connected to the precharge node 27 and supplies a driving current $I_P$ correlated to the driving voltage $V_P$.

The comparison stage 18 comprises a plurality of bit comparators 35 equal in number to the number of the array lines 13 that are selected during reading (64 in the example illustrated). In particular, each of the bit comparators 35 has an inverting terminal connected to a respective array node 20, a non-inverting terminal, connected to the reference node 21 via a common connection line 36, and an output terminal connected to a respective memory element 37, for example a bistable (latch). The bit comparators 35 have respective input capacitances $C_{IN}$, and a connection capacitance $C_L$ is associated to the connection line 36. In FIG. 2 the input capacitances $C_{IN}$ are connected between respective non-inverting inputs of the bit comparators 35 and ground. The connection capacitance $C_L$ is connected to the connection line 36 and ground.

The storage elements 37 have respective outputs, defining the output terminals 11 of the reading circuit 3, and control terminals 37a, receiving a same control signal $S_{LS}$ of logic type, which, when it has a preset logic value, enables sampling of the logic values present on the output terminals 11 in a known way.

The control signal $S_{LS}$ is generated by a sampling comparator 38 having an inverting input connected to the reference node 21, a non-inverting input connected to a dummy bit line 40, and an output connected to the control terminals 37a of the storage elements 37. In particular, the sampling-comparator output supplies the sampling signal $S_{LS}$. The dummy bit line 40 is formed by a bit line similar to the array lines 13 but dimensioned so as to discharge more slowly than all the array lines 13 connected to the erased array cells 4 (in practice, the dummy bit line 40 is connected to a dummy memory cell 40a which is only slightly erased and which consequently conducts a lower current than the erased memory cells 4). In this way, the output of the sampling comparator 38 switches to the sampling value only when the outputs of all the other bit comparators 35 are already stabilized.

Operation of the reading circuit 3 is described below.

In standby, when the memory 1 is not read or written, the first standby circuit 29 is active and maintains the precharge node 27 at the precharge voltage $V_{PC}$, while the regulator 31 is deactivated. In addition, the enabling transistors 25 of the control circuits 16a, 16b, 16c receive, on their respective gate terminals, an enabling voltage $V_A$ of zero value and are therefore off; the array lines 13, the reference line 14, and the equalization line 15 are therefore disconnected from the precharging circuit 17.

When reading is requested, the reading circuit 3 is set in a precharge configuration. In particular, the regulator 31 is activated (in a per se known manner), and the supply voltage $V_A$ assumes an enabling value so that the enabling transistors 25 conduct and connect the precharge node 27 to the array node 20, the reference node 21, and the equalization node 22. Furthermore, the equalization switches 23, 26 are closed by of the equalization signal $S_{EQ}$, so that all the array lines 13 selected during reading and the reference line 14 will be directly connected to the equalization line 15.

Since the capacitances associated to the array node 20, the reference node 21, and the equalization node 22 are initially discharged and altogether have a high value, the voltage on the precharge node 27 rapidly decreases. Consequently, the regulator 31 intervenes to supply a precharge current until the voltage at the reference node returns to the precharge value $V_{PC}$. In this phase, the array node 20, the reference node 21, and the equalization node 22 are directly connected together, and all the capacitances associated to them are charged so that, at the end of precharging, the array node 20, the reference node 21 and the equalization node 22 are at the same voltage.

Throughout precharging, the control transistors 24 are biased so as to work in the linear region, so that the respective drain-to-source voltages are close to 0 V and substantially independent of the currents flowing through the control transistors 24. Consequently, precharging is carried out in a uniform way both for the array nodes 20 connected to programmed array cells 4, which conduct very low currents, and for the array nodes 20 connected to erased array cells 4, which conduct high currents, as well as for the reference node 21 and the equalization node 22. In this way, at the end of precharging, all the array nodes 20, the reference node 21 and the equalization node 22 are at uniform voltage levels close to the precharge voltage $V_{PC}$, regardless of the currents flowing in the various cells.

In addition, when one of the array nodes 20, reference node 21 or equalization node 22 reaches the precharge voltage $V_{PC}$, the control transistor 24 of the respective control circuit 16 is off and selectively interrupts precharging for that node. The control transistors 24, in fact, receive the reference voltage $V_{REF}$ on their gate terminals. Consequently, since the precharge voltage $V_{PC}$ is equal to $V_{REF}-V_T$ and the drain-to-source voltage of the enabling transistors 25 is close to 0 V, when one of the array nodes 20, reference node 21 or equalization node 22 reach the precharge voltage $V_{PC}$, the gate-to-source voltage of the respective control transistor 24 (equal to $V_{REF}-V_{PC}$) becomes lower than the threshold voltage $V_T$. The control transistor 24 is thus turned off, so interrupting the connection with the precharging circuit 17.

Once a preset time interval has elapsed, precharging is interrupted, and the reading circuit 3 is set in a discharge comparison configuration. In detail, the enabling transistors 25 are turned off, thus disconnecting the precharging circuit 17 from all the array nodes 20 and from the reference node 21 and the equalization node 22; and the equalization switches 23, 26 are opened so as to provide electrical isolation of the equalization line 15 from the array lines 13 and from the reference line 14.

Figure 4:
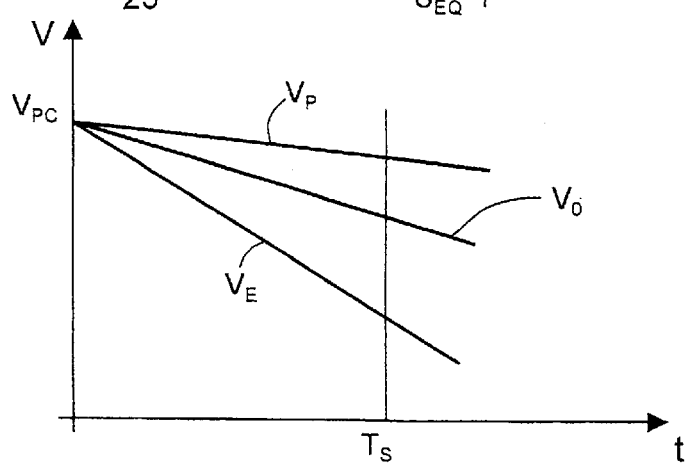
FIG. 4 shows plots of electrical quantities taken in the reading circuit of FIG. 2.

The array nodes 20, where initially the precharge voltage $V_{PC}$ is present, discharge at a rate that depends on the programmed state of the array cells 4 that are selected during reading, to which they are connected, as illustrated in FIG. 4. In particular, this figure shows at $V_E$ the plot, during discharging, of the voltage of an array node 20 connected to an erased cell, which has a low threshold voltage and conducts a cell current $I_F$, and at $V_P$ the plot, during discharging, of the voltage of an array node 20 connected to a programmed cell, which has a high threshold voltage and conducts a substantially zero current.

FIG. 4 also illustrates the plot of the voltage $V_O$ at the reference node 21 during discharging. The rate of discharging of the reference node 21 is approximately equal to half the rate of discharging of the array nodes 20 connected to erased array cells 4. In fact, equal cell currents $I_F$ flow in the reference cell 14a and in the erased array cells 4; the overall capacitance associated to the reference node 21 is, however, roughly equal to the sum of the capacitances associated to the reference line 21 (equal to $2C_{BL}$), while only the line capacitance $C_{BL}$ is associated to each array node 20. In other words, during discharging, the plot of the voltage at the reference node 21 is equivalent to the plot of the voltage of a node which has, associated thereto, an equivalent capacitance equal to the line capacitance $C_{BL}$ and discharged with a discharge current $I_F/2$.

In addition, the presence of the connection capacitance $C_L$ and of the input capacitance $C_{IN}$ of all the bit comparators 35 has a limited effect on the discharging rate of the reference node 21. In fact, since the capacitance associated to the reference line 14 (equal to $2C_{BL}$) is very high, the influence of the connection capacitance $C_L$ and of the input capacitance $C_{IN}$ is, in percentage terms, far from significant, and the equivalent capacitance is roughly equal to the line capacitance $C_{BL}$ associated to each of the array lines 13. Consequently, the capacitive mismatching between the array lines 13 and the reference line 14 is contained, and, during discharging, the voltage of the reference node 21 is easily distinguished from the voltages present both on the array nodes 20 connected to erased cells and on the array nodes 20 connected to programmed cells.

The bit comparators 35 compare the voltages on the array nodes 20 and on the reference node 21, which thus form a set of comparison nodes. As discharging proceeds, in particular, the bit comparators 35 switch respectively to one first logic value, if the respective first inputs are connected to erased array cells 4, and to a second logic value, if the respective first inputs are connected to programmed array cells 4. After elapsing of a comparison time interval $T_S$ (FIG. 4), determined by the discharging rate of the dummy memory cell 40a so as to enable all the outputs of the bit comparators 35 to stabilize, also the sampling comparator 38 switches, bringing the sampling signal $S_{LS}$ to the sampling value. In this way, the logic values present on the outputs of the bit comparators 35 are stored in the respective storage elements 37 and supplied on the output terminals 11 of the reading circuit 3.

The described reading circuit presents a number of advantages. In particular, the capacitive mismatching between the array bit lines and the reference bit line is considerably reduced as compared to known circuits, principally for two reasons. First of all, the use of an equalization bit line distinct from the reference bit line makes it possible to reduce the capacitive load associated to the reference bit line. In fact, the line used for equalization, which in known circuits coincides with the reference bit line, must be able to be alternatively connected to, and disconnected from, all the array bit lines through respective equalization switches, each of which has an own capacitance. As emphasized previously, this represents a drawback in known circuits, in so far as the overall capacitance associated to the switches affects the discharging rate of the reference bit lines, which cannot be distinguished from the discharging rate of a programmed cell. According to the reading circuit 3, instead, the capacitive load due to the equalization switches affects the equalization bit line, but not the reference bit line, which is connected to a single switch. In addition, the equalization bit line does not intervene during discharge comparison, and hence the capacitance associated thereto does not represent a drawback. Second, capacitive mismatching is reduced thanks to the structure of the reference bit line, which includes two cell columns connected in parallel by respective local lines and thus having altogether an associated capacitance of $2C_{BL}$. In this way, in fact, the contribution that is due to the input capacitances of the bit comparators and of the connection capacitance and is unvaried as compared to the prior art, carries less weight in percentage terms.

Thanks to the reduced capacitive mismatching, the plots of the voltages of the reference node and of the array nodes connected to programmed array cells differ more than in known circuits, and hence the danger of reading errors is reduced.

The described reading circuit enables, then, a better regulation of the precharge voltage during the precharge phase. The presence of the control transistors receiving the reference voltage enables, in fact, selective interruption of precharge for the nodes (array nodes, equalization node, and reference node) that have reached the precharge voltage. In this case, in fact, the control transistors have a gate-to-source voltage lower than the threshold voltage and turn off. Thereby, the voltages at the array nodes are uniform and independent of whether the nodes are connected to programmed memory cells or to erased memory cells. Furthermore, this advantage is obtained thanks to a very simple circuit solution.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A direct-comparison reading circuit for a nonvolatile memory array having a plurality of memory cells arranged in rows and columns, and a bit line, the reading circuit comprising:
    an array line, selectively connectable to said bit line, and a reference line;
    a precharging circuit for precharging said array line and said reference line at a preset precharging potential;
    a comparator having a first terminal connected to said array line, and a second terminal connected to said reference line; and
    equalization means for equalizing potentials of said array line and reference line, in a precharging step, said equalization means comprise an equalization line distinct from said reference line; and
    controlled connection means for connecting, in said precharging step, said equalization line to said array line and to said reference line, and for disconnecting said equalization line from said array line and from said reference line, at the end of said precharging step.

2. A circuit according to claim 1, wherein said equalization means comprise an equalization column, equal to said array columns.

3. A circuit according to claim 2, wherein said equalization means comprise a first switch and a second switch having respective first terminals connected to said equalization line; said first switch having a respective second terminal connected to said array line, and said second switch having a respective second terminal connected to said reference line.

4. A circuit according to claim 2, further comprising an array control circuit, a reference control circuit, and an equalization control circuit, connected between said precharging circuit and, respectively, said array line, said reference line, and said equalization line; said array control circuit, said reference control circuit, and said equalization control circuit being activatable during said precharging step for selectively connecting said array line, said reference line and said equalization line to said precharging circuit when voltages at said array line, said reference line and said equalization line are lower than said precharge potential.

5. A circuit according to claim 4, wherein said array control circuit, said reference control circuit and said equalization control circuit comprise respective control transistors having respective drain terminals connected to said precharging circuit and receiving on respective control terminals a preset reference voltage independent of a supply voltage; said control transistors further having source terminals connected, respectively, to said array line, said reference line and said equalization line.

6. A circuit according to claim 5, wherein said control transistors are natural NMOS transistors.

7. A circuit according to claim 6, wherein said precharge potential is correlated to said reference voltage and to a threshold voltage of said control transistors.

8. A circuit according to claim 1 wherein said reference line is connected to a reference branch comprising a pair of reference columns equal to said array columns, and a reference cell; said reference columns being connected in parallel between said reference line and a drain terminal of said reference cell through respective local lines.

9. In a direct-comparison reading circuit for a nonvolatile memory array that includes a plurality of memory cells arranged inn rows and columns, and a bit line, the reading circuit including: an array line, selectively connectable to said bit line, and a reference line; a precharging circuit for precharging said array line and reference line at a pre-set precharging potential; a comparator having a first terminal connected to said array line, and a second terminal connected to said reference line; and equalization means for equalizing potentials of said array lines and reference line, in a precharging step; a method for reading the memory cells, comprising the steps of:

providing an equalization line distinct from said reference bit line;

connecting, in the precharging step, said equalization line to said array line and to said reference line; and disconnecting said equalization line from said array line and from said reference line at the end of said precharging step.

10. A direct-comparison reading circuit for a nonvolatile memory array having a plurality of memory cells arranged in rows and columns, and a bit line, the reading circuit comprising:

an array line, selectively connected to the bit line;

a reference cell coupled to a reference line;

an equalization cell coupled to an equalization line distinct from the reference line;

a first control switch connecting the equalization line to the array line and having a control terminal coupled to a control signal; and a second control switch connecting the equalization line to the reference line and having a control terminal coupled to the control signal.

11. The reading circuit of claim 10, further comprising:

a precharging circuit for precharging the array line and the reference line at a preset precharging potential; and a comparator having a first terminal connected to the array line, and a second terminal connected to the reference line.

12. The reading circuit of claim 11, further comprising:

an array control circuit connected between the precharging circuit and the array line, and structured to selectively connect the array line to the precharging circuit when a voltage at the array line is lower than the precharge potential;

a reference control circuit connected between the precharging circuit and the reference line, and structured to selectively connect the reference line to the precharging circuit when a voltage at the reference line is lower than the precharge potential; and an equalization control circuit connected between the precharging circuit and the equalization line, and structured to selectively connect the equalization line to the precharging circuit when a voltage at the equalization line is lower than the precharge potential line.

13. A circuit according to claim 12 wherein the array control circuit, the reference control circuit, and the equalization control circuit comprise respective control transistors having respective drain terminals connected to the precharging circuit and receiving on respective control terminals a preset reference voltage independent of a supply voltage; the control transistors further having source terminals connected, respectively, to the array line, the reference line and the equalization line.

14. A circuit according to claim 13, wherein the control transistors are natural NMOS transistors.

15. A circuit according to claim 13, wherein the precharge potential is correlated to the reference voltage and to a threshold voltage of the control transistors.

16. A circuit according to claim 10 wherein the reference line is connected to a reference branch comprising a pair of reference columns equal to the array columns, and a reference cell; the reference columns being connected in parallel between the reference line and a drain terminal of the reference cell through respective local lines.

* * * * *